(12) United States Patent
Kang

(10) Patent No.: US 10,816,406 B2
(45) Date of Patent: Oct. 27, 2020

(54) INFRARED DETECTOR PIXEL STRUCTURE AND MANUFACTUREING METHOD THEREOF

(71) Applicant: SHANGHAI IC R&D CENTER CO., LTD., Shanghai (CN)

(72) Inventor: Xiaoxu Kang, Shanghai (CN)

(73) Assignee: SHANGHAI IC R&D CENTER CO., LTD, Shanghai (CN)

(*) Notice: Subject to any disclaimer, the term of this patent is extended or adjusted under 35 U.S.C. 154(b) by 0 days.

(21) Appl. No.: 16/311,060

(22) PCT Filed: Sep. 8, 2016

(86) PCT No.: PCT/CN2016/098380
§ 371 (c)(1),
(2) Date: Dec. 18, 2018

(87) PCT Pub. No.: WO2018/014438
PCT Pub. Date: Jan. 25, 2018

(65) Prior Publication Data
US 2019/0145830 A1 May 16, 2019

(30) Foreign Application Priority Data

Jul. 18, 2016 (CN) .......................... 2016 1 0564510
Jul. 18, 2016 (CN) .......................... 2016 1 0564866

(51) Int. Cl.
*G01J 5/38* (2006.01)
*H01L 41/29* (2013.01)
*H01L 41/312* (2013.01)
*H01L 41/113* (2006.01)
*H01L 41/047* (2006.01)

(52) U.S. Cl.
CPC ............ *G01J 5/38* (2013.01); *H01L 41/0475* (2013.01); *H01L 41/1132* (2013.01); *H01L 41/29* (2013.01); *H01L 41/312* (2013.01)

(58) Field of Classification Search
CPC ....... G01J 5/38; G01J 5/0853; H01L 41/0475; H01L 41/29; H01L 41/312; H01L 41/1132
See application file for complete search history.

(56) References Cited

U.S. PATENT DOCUMENTS 5,142,414 A * 8/1992 Koehler .................... G01J 3/26
356/519
5,286,976 A * 2/1994 Cole ........................ H01L 27/16
250/338.1

(Continued)

*Primary Examiner* — Christine S. Kim
(74) *Attorney, Agent, or Firm* — Tianchen LLC.; Yuan R. Li; Yi Fan Yin

(57) ABSTRACT

The present invention provides an infrared detector pixel structure and manufacturing method thereof. The bottom portion of a silicon substrate is bonded with a bonding substrate, an infrared absorbing layer in the bonding substrate is used for absorbing a part of infrared light, a closed cavity filled with infrared-sensitive gas is set in the silicon substrate, and a piezoelectric transforming unit is bonded onto the closed cavity. When the infrared-sensitive gas absorbs the infrared light to expand, the infrared sensitive gas will press the piezoelectric transforming unit, which causes piezoelectric signal generated by the piezoelectric transforming unit to be changed, thereby achieving the detection on the infrared light.

13 Claims, 11 Drawing Sheets

(56) References Cited

U.S. PATENT DOCUMENTS

| | | | | |
|---|---|---|---|---|
| 5,436,452 A * | 7/1995 | Kenny | ............... | G01J 5/42 |
| | | | | 250/338.1 |
| 5,550,373 A * | 8/1996 | Cole | ............... | G01J 3/02 |
| | | | | 250/338.1 |
| 7,378,655 B2 * | 5/2008 | Tai | ............... | G01J 3/26 |
| | | | | 250/338.1 |
| 2009/0121136 A1 * | 5/2009 | Gruss | ............... | G01J 5/02 |
| | | | | 250/336.1 |
| 2014/0042324 A1 * | 2/2014 | Kropelnicki | ............... | G01J 5/02 |
| | | | | 250/340 |

\* cited by examiner

INFRARED DETECTOR PIXEL STRUCTURE AND MANUFACTUREING METHOD THEREOF

CROSS-REFERENCE TO RELATED APPLICATION

The application claims the priority benefit of International Patent Application Serial No. PCT/CN2016/098380, filed Sep. 8, 2016, which is related to and claims the priority benefit of China patent application serial No. 201610564866.4, filed with the Chinese Patent Office on Jul. 18, 2016 and entitled as "INFRARED DETECTOR PIXEL STRUCTURE AND MANUFACTUREING METHOD THEREOF", and Chinese Patent Application No. 201610564510.0, filed with the Chinese Patent Office on Jul. 18, 2016 and entitled as "INFRARED DETECTOR PIXEL STRUCTURE AND MANUFACTUREING METHOD THEREOF", which are incorporated in the present application by reference in its entirety.

FIELD OF THE INVENTION

The present invention relates to a field of semiconductor technology, and in particular, to an infrared detector pixel structure and a manufacturing method thereof.

BACKGROUND OF THE INVENTION

The infrared detector is a device which converts incident infrared radiation signal into electrical signal to output. The device detects the existence or movement of objects by using a thermal element, and collects infrared radiation from the outside and then gathers it on the infrared sensor. The thermal element outputs signal when the temperature changes after accepting the infrared radiation, converts the signal into electrical signal, and then performs waveform analysis on the electrical signal. In the conventional infrared detector pixel structure, only one type of thermistor which is usually amorphous silicon or vanadium oxide with a negative temperature coefficient is used, and signal of the change thereof is amplified and output by a circuit.

However, for a detector structure using a thermal element, the sensitivity is generally not very high, the structure is relatively complicated, and the detection process is complicated. If a thermal element with higher sensitivity is used, the material cost is expensive.

Therefore, there is an urgent need to improve existing infrared detector to enhance sensitivity and reduce structural complexity and cost.

BRIEF SUMMARY OF THE DISCLOSURE

In order to overcome the above problems, the present invention is directed to provide an infrared detector pixel structure and a manufacturing method thereof.

In order to achieve the above objects, an infrared detector pixel structure of the present invention comprises a bonding substrate, a silicon substrate bonded onto the bonding substrate, and a piezoelectric transforming unit located on the silicon substrate; wherein, there is an infrared absorbing layer in the bonding substrate; the infrared absorbing layer is used for absorbing infrared light; a closed cavity region filled with infrared-sensitive gas is included in the silicon substrate; the piezoelectric transforming unit is located above the closed cavity region of the silicon substrate; wherein, after the infrared light is selectively passed by an infrared window layer, a part of the infrared light is absorbed by the infrared absorbing layer, a part of the infrared light enters into the closed cavity through the infrared absorbing layer and is absorbed by the infrared-sensitive gas in the closed cavity; the infrared-sensitive gas in the closed cavity generates quantity of heat after absorbing the infrared light and the quantity of heat generated after the infrared absorbing layer absorbs infrared light is transferred to the infrared-sensitive gas, such that the infrared-sensitive gas occurs expansion and acts on the piezoelectric transforming unit, and the piezoelectric signal formed by the piezoelectric transforming unit changes, to achieve detection on the infrared light.

Preferably, the infrared detector pixel structure further comprises an oxide layer on the surface of the edge region of the silicon substrate outside the closed cavity region; the piezoelectric transforming unit comprises a bottom electrode, a top electrode, and a piezoelectric material layer located between the bottom electrode and the top electrode; the bottom electrode is bonded onto the silicon substrate and the oxide layer; the bottom electrode is directly in contact with the closed cavity; when the infrared-sensitive gas occurs expansion and acts on the piezoelectric transforming unit, the piezoelectric signal formed by the piezoelectric material layer changes and the changed piezoelectric signal is transmitted to an external circuit by the top electrode and the bottom electrode.

Preferably, The infrared detector pixel structure according to claim 2, wherein the closed cavity region of the silicon substrate has an upper comb-like unit and a lower comb-like unit, and the top portion of the upper comb-like unit is in contact with and connected to the bottom electrode; the lower side of the bottom electrode is connected with a plurality of contact blocks of which bottom portion is in contact with and connected to the top portion of the upper comb-like unit; the comb-tooth of the upper comb-like unit and the comb-tooth of the lower comb-like unit are set alternately; there is gap between the bottom portion of the upper comb-like unit and the infrared absorbing layer; the bottom portion of the cavity between the comb teeth of the lower comb-like unit is in contact with and connected to the infrared absorbing layer; the cavity between the upper comb-like unit and the lower comb-like unit is sealed by the bottom electrode, the oxide layer, the silicon substrate other than the closed cavity and the bonding substrate to form the closed cavity region.

Preferably, the bonding substrate further has an interconnection circuit therein; the comb teeth of the upper comb-like unit and the lower comb-like unit which are adjacent and the infrared-sensitive gas therebetween constitute a vertical capacitance, the lower electrode of the vertical capacitance is constituted by electrically connecting the comb tooth of the lower comb-like unit to the interconnection circuit, and the bottom electrode of the piezoelectric transforming unit is served as upper electrode of the vertical capacitance; when the infrared-sensitive gas occurs expansion, the pressure of the infrared-sensitive gas acts on the piezoelectric transforming unit and the vertical capacitance, which results in that the capacitance signal of the vertical capacitance changes and the piezoelectric signal of the piezoelectric material layer changes, the changed piezoelectric signal is transmitted to the external circuit by the top electrode and the bottom electrode, and the changed capacitance signal is transmitted to the external circuit by the interconnection circuit and the bottom electrode, thereby achieving detection on the infrared light.

Preferably, the infrared window layer has a plurality of trenches which are located below a region between the adjacent comb teeth of the lower comb-like unit and below the silicon substrate other than the closed cavity but not located below the comb teeth of the lower comb-like unit; the infrared absorbing layer is filled in the plurality of trenches.

Preferably, the top portion of the piezoelectric transforming unit further has a dielectric protecting layer which covers on the entire piezoelectric transforming unit.

Preferably, the surface of the edge region of the silicon substrate other than the closed cavity region has an oxide layer; in the piezoelectric transforming unit, the piezoelectric material layer corresponds to upper side of the upper comb-like unit and the edge region of the piezoelectric material layer is not located in the region corresponding to upper side of the oxide layer, the edge region of the bottom electrode covers on the oxide layer, and the length of the top electrode is smaller than the length of the piezoelectric material layer, such that the dielectric protecting layer covering on the entire piezoelectric transforming unit forms a multi-stepwise structure.

Preferably, in the bonding substrate, it is further provided with an infrared window layer located at the bottom portion of the infrared absorbing layer, the infrared window layer being used for selecting waveband of the infrared light passing through therefrom.

Preferably, wherein the piezoelectric transforming unit includes a first MOS device with a first conductive type channel and a second MOS device with second conductive type channel surrounding the periphery of the first MOS device; the first conductive type and the second conductive type are opposite; the first conductive type channel corresponds to middle region above the closed cavity, and the second conductive type channel spans on a part of interlayer dielectric above the sidewalls of the closed cavity and is set around the first conductive type channel.

In order to achieve the above objects, the present invention further provides a method of manufacturing the infrared detector pixel structure wherein comprising of:

step 01: providing a bonding substrate in which the infrared absorbing layer is formed;

step 02: providing a silicon substrate in which a closed cavity region filled with infrared-sensitive gas is formed to bond the silicon substrate with the bonding substrate;

step 03: bonding the piezoelectric transforming unit onto the silicon substrate and making the piezoelectric transforming unit be directly in contact with the closed cavity; wherein, the piezoelectric transforming unit includes a bottom electrode, a top electrode, and a piezoelectric material layer located between the top electrode and the bottom electrode.

Preferably, the step 02 specifically comprises of:

step 021: depositing the oxide layer on the top portion of the silicon substrate;

step 022: etching out the upper comb-like unit and the lower comb-like unit in the silicon substrate, wherein, the top portion of the upper comb-like unit and the top portion of the lower comb-like unit are in contact with the oxide layer; the bottom portion of the upper comb-like unit is higher than that of the lower comb-like unit;

step 023: bonding the bonding substrate with the bottom portion of the silicon substrate;

step 024: etching out recesses in the oxide layer corresponding to the top portion of the comb teeth of the upper comb-like unit;

step 025: filling conductive material in the recesses and planarizing the top portion of the conductive material to be aligned with the top portion of the oxide layer, to form the contact blocks;

step 026: removing the oxide layer corresponding to the upper side of the closed cavity region to remain the oxide layer on the surface of the edge region of the silicon substrate other than the closed cavity region.

Preferably, the step 01 specifically comprises of: firstly forming an infrared window layer in the bonding substrate; then etching out a plurality of trenches in the infrared window layer, wherein the trenches are located below a region between the adjacent comb teeth of the lower comb-like unit and below the silicon substrate other than the closed cavity but not located below the comb teeth of the lower comb-like unit; further depositing the infrared absorbing layer in the plurality of trenches.

Preferably, the step 01 specifically comprises of: sequentially forming the infrared absorbing layer and the infrared window layer in the bonding substrate; and providing a SOI substrate; the SOI substrate has a bottom silicon layer, an interlayer dielectric and a top silicon layer.

The step 02 specifically comprises of:

step 021': reversing the SOI substrate, and forming the first cavity and the second cavity in the bottom silicon layer in a vacuum environment;

step 022': depositing the reflective layer in the first cavity in the vacuum environment;

step 023': bonding the bottom portion of the bonding substrate with the bottom silicon layer in the vacuum environment, and filling the infrared-sensitive gas in the first cavity and the second cavity during bonding.

The step 03 specifically comprises of:

step 031': etching out a first opening in the bonding substrate, the first opening penetrating through the bonding substrate and being located above a region between the first cavity and the second cavity;

step 032': reversing the SOI substrate again and forming a first MOS device with first conductive type channel and a second MOS device with second conductive type channel in the top silicon layer;

step 033': etching out second opening in the top silicon layer and the interlayer dielectric and in correspondence to upper side of the second cavity, wherein the infrared-sensitive gas in the second cavity is released out by vacuuming via the second opening;

step 034': depositing pre-metal dielectric on the SOI substrate which has been subjected to the step 033' in the vacuum environment; the pre-metal dielectric sealing the top portion of the second opening such that it is in a vacuum state in the second opening;

step 035': forming the back-end interconnection layer on the pre-metal dielectric and then etching out a third opening in the back-end interconnection layer, the pre-metal dielectric, the top silicon layer and the interlayer dielectric; the third opening corresponding to upper side of the region between the first cavity and the second cavity.

According to the technical scheme, the infrared detector pixel structure and manufacturing method of the present invention as that, the bonding substrate is bonded to the bottom portion of the silicon substrate, the infrared window material layer in the bonding substrate is used to selectively make the infrared light with the desired waveband pass through, the infrared absorbing layer in the bonding substrate is used to absorb a part of the infrared light, the closed cavity filled with the infrared-sensitive gas is set in the silicon substrate and the piezoelectric transforming unit is bonded on the closed cavity, so that the piezoelectric transforming unit will be pressured when the infrared-sensitive gas absorbs the infrared light and expands, which results in that the piezoelectric signal generated by the piezoelectric transforming unit changes, thereby achieving the detection on the infrared light. Further, the upper comb-like unit and the lower comb-like unit are set in the silicon substrate, so as to simultaneously constitute a vertical capacitance and the closed cavity filled with the infrared-sensitive gas. The quantity of heat generated after the infrared absorbing layer absorbed the infrared light is transferred to the infrared-sensitive gas, while the infrared-sensitive gas itself also generates the quantity of heat after absorbing the infrared light, such that the infrared-sensitive gas occurs expansion, it results in that the upper comb-like unit and the lower comb-like unit relatively shift to cause the change in the capacitance of the vertical capacitance, meanwhile the expansion of the infrared-sensitive gas causes the change in the piezoelectric signal of the piezoelectric transforming unit, thereby achieving the detection on the infrared light.

DETAILED DESCRIPTION OF THE EMBODIMENTS

Figure 1:
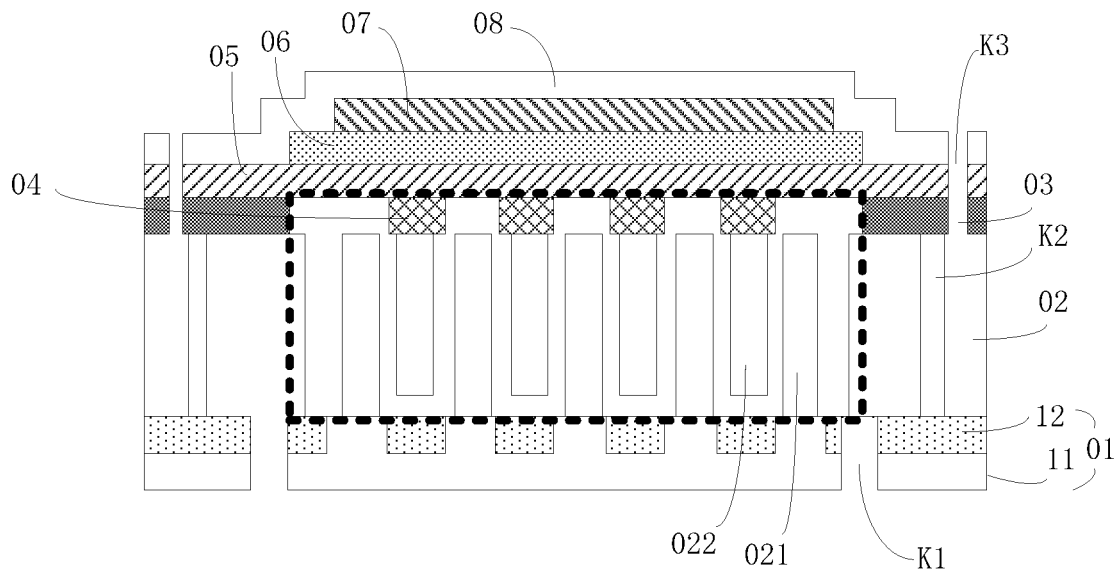
FIG. 1 is a schematic diagram of an infrared detector pixel structure according to a preferred embodiment of the present invention
Figure 2:
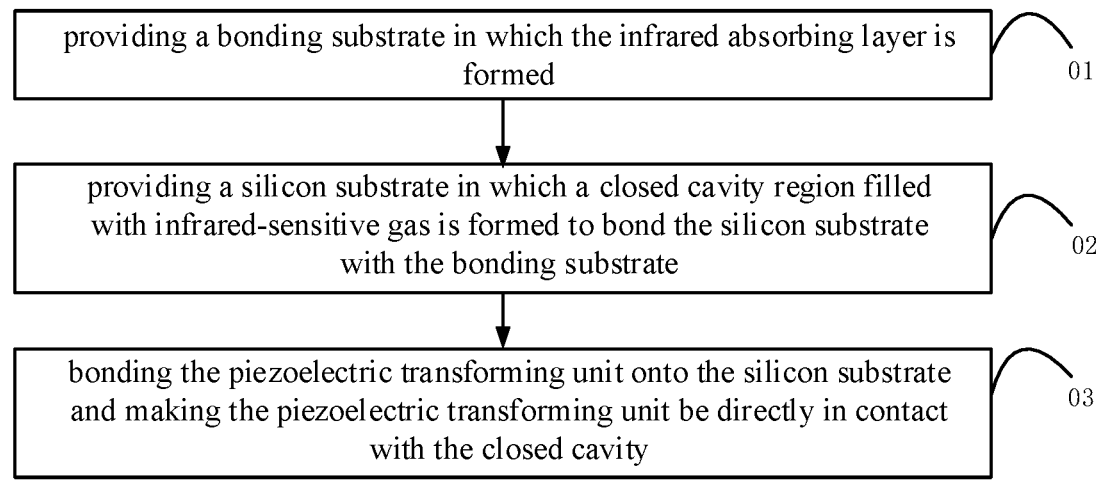
FIG. 2 is a schematic flow chart of a manufacturing method of an infrared detector pixel structure according to a preferred embodiment of the present invention

In order to make the contents of the present invention clearer and easier to understand, the contents of the present invention will be further described below in combination with the drawings. Certainly, the present invention is not limited to the specific embodiment, and general replacements well known to persons skilled in the art are also encompassed within the protection scope of the present invention.

The infrared detector pixel structure of the present invention comprises a bonding substrate, a silicon substrate bonded onto the bonding substrate, and a piezoelectric transforming unit located on the silicon substrate. Wherein, there is an infrared absorbing layer in the bonding substrate; the infrared absorbing layer is used for absorbing infrared light; a closed cavity region filled with infrared-sensitive gas is included in the silicon substrate; the piezoelectric transforming unit is located above the closed cavity region of the silicon substrate; wherein, after infrared light enters into the infrared absorbing layer, a part of the infrared light is absorbed by the infrared absorbing layer, a part of the infrared light enters into the closed cavity through the infrared absorbing layer and is absorbed by the infrared-sensitive gas in the closed cavity; the infrared-sensitive gas in the closed cavity generates quantity of heat after absorbing the infrared light and the quantity of heat generated after the infrared absorbing layer absorbs infrared light is transferred to the infrared-sensitive gas, such that the infrared-sensitive gas occurs expansion and acts on the piezoelectric transforming unit, which results in that piezoelectric signal formed by the piezoelectric transforming unit changes so as to achieve detection on the infrared light.

In one embodiment of the present invention, the piezoelectric transforming unit is constituted by the piezoelectric material and uses the feature that electrical signal generated when the piezoelectric material is subjected to stress changes. In one embodiment, the piezoelectric transforming unit is constituted by a MOS device, and uses the feature that electrical signal generated when the channel of the MOS device is subjected to stress changes. In one embodiment, a further piezoelectric transforming unit can be set inside the closed cavity, and the piezoelectric transforming unit is constituted by a capacitance structure and uses the feature that electrical signal generated when the capacitance structure is subjected to stress changes. In one embodiment, a reflective layer may be set at the top portion and sidewalls of the closed cavity and is used to reflect the infrared light entering the closed cavity to the inside of the closed cavity to be absorbed by the infrared-sensitive gas, and the infrared light which is not absorbed by the infrared-sensitive gas is further absorbed by the infrared absorbing layer at the bottom portion of the closed cavity.

In another embodiment of the present invention, the silicon substrate having a closed cavity is bottom silicon layer of SOI substrate, and there are an intermediate dielectric layer and a top silicon layer above the bottom silicon layer; the piezoelectric transforming unit is located above the closed cavity in the bottom silicon layer, and includes a first MOS device with a first conductive type channel and second MOS device with second conductive type channel surrounding the periphery of the first MOS device; the first conductive type and the second conductive type are opposite; the first conductive type channel corresponds to a middle region above the closed cavity, and the second conductive type channel spans on a part of the intermediate dielectric layer above the sidewalls of the first closed cavity and is set around the first conductive type channel.

In some embodiments of the present invention, in the bonding substrate other than the lower side of the closed cavity, it may be provided with an opening for performing isolation between the adjacent pixel units; in the silicon substrate other than the closed cavity, it may be also provided with an opening for isolating the closed cavity from the adjacent pixel structure; in the edge region of the piezoelectric transforming unit other than the upper side of the closed cavity, it may be also provided with an opening, for isolating the piezoelectric transforming unit from the adjacent pixel structure, so as to avoid crosstalk between adjacent pixels.

Embodiment 1

Hereinafter, the present invention will be described in detail with reference to FIGS. 1-12 and specific embodiments. It should be noted that the drawings are made by adopting a very simplified form and using a non-precise ratio, and the purpose thereof is to auxiliary explain the present embodiment in an easy and clear way.

Referring to FIG. 1, in the present embodiment, the infrared detector pixel structure comprises: a bonding substrate 01, a silicon substrate 02 on the bonding substrate 01, a closed cavity region (indicated in a dotted line frame) located in the silicon substrate 02, and a piezoelectric member (the piezoelectric member is the piezoelectric transforming unit in the present embodiment, and the piezoelectric transforming unit of other embodiments of the present invention is not limited to the piezoelectric member), wherein there is an oxide layer 03 on the surface of the edge regions of the silicon substrate 02 other than the upper side of the closed cavity region, and the oxide layer 03 isolates the edge regions of the silicon substrate 02 from the piezoelectric member.

An infrared window layer 11 and an infrared absorbing layer 12 are sequentially included in the bonding substrate 01 from bottom to top, the infrared window layer 11 has a plurality of trenches and the infrared absorbing layer 12 is filled in the plurality of trenches. The trenches are located below the region between the adjacent comb teeth of the lower comb-like unit 021 and below the silicon substrate 02 other than the closed cavity, but are not located below the comb teeth of the lower comb-like unit 021; in the bonding substrate 01 other than the lower side of the closed cavity, it may be provided with a first opening K1 for performing isolation between the adjacent pixel units.

The piezoelectric transforming unit has a bottom electrode 05, a piezoelectric material layer 06 and a top electrode 07. Wherein at the top portion of the top electrode 07, it is further provided with a dielectric protection layer 08 which covers on the entire piezoelectric member, the piezoelectric material layer 06 corresponds to upper side of the upper comb-like unit 022 and the edge region of the piezoelectric material layer 06 is not located in a region corresponding to the upper side of the oxide layer 03, the edge region of the bottom electrode 05 covers on the oxide layer 03, and the length of the top electrode 07 is smaller than that of the piezoelectric material layer 06, so that the dielectric protection layer 08 covering on the entire piezoelectric transforming unit forms a multi-stepwise structure. In the piezoelectric transforming unit which corresponds to the oxide layer 03 and is above the oxide layer 03, it is further provided with a third opening K3 for isolating the piezoelectric transforming unit from the adjacent pixel structure.

The closed cavity region of the silicon substrate 02 has the upper comb-like unit 022 and the lower comb-like unit 021, and the top portion of the upper comb-like unit 022 is in contact with and connected to the bottom electrode 05. Wherein lower side of the bottom electrode 05 is connected with a plurality of contact blocks 04, and the bottom portion of the plurality of contact blocks 04 is in contact with and connected to the top portion of the upper comb-like unit 022; the material of the contact block 04 is the same as the material of the bottom electrode 05; the comb tooth of the upper comb-like unit 022 and the comb tooth of the lower comb-like unit 021 are set alternately. There is gap between the bottom portion of the upper comb-like unit 022 and the infrared absorbing layer 12; the bottom portion of the cavity between the comb teeth of the lower comb-like unit 021 is in contact with and connected to the infrared absorbing layer 12. The cavity between the upper comb-like unit 022 and the lower comb-like unit 021 is sealed by the bottom electrode 05, the oxide layer 03, the silicon substrate 02 other than closed cavity and the bonding substrate 01 so as to form the closed cavity region. Herein, the bottom electrode 05 of the piezoelectric member is bonded on the contact block 04 and the oxide layer 03, and the bottom portion of the bottom electrode 05 is aligned with the top portion of the oxide layer 03. In the silicon substrate 02 other than the closed cavity, it may be provided with a second opening K2 for isolating the closed cavity from the adjacent pixel structure. Herein, a ratio of the height of the upper comb-like unit 022 to the height of the lower comb-like unit 021 may be (10~40): 1.

In the present embodiment, the bonding substrate 10 has also an interconnection circuit therein, and the comb teeth of the adjacent upper comb-like unit 022 and the lower comb-like unit 021 and the infrared-sensitive gas therebetween constitute a vertical capacitance; the comb tooth of the lower comb-like unit 021 is electrically connected to the interconnection circuit so as to constitute a lower electrode of the vertical capacitance, and the bottom electrode 05 of the piezoelectric member is served as an upper electrode of the vertical capacitance.

Therefore, when the infrared-sensitive gas occurs expansion, the pressure of the infrared-sensitive gas acts on the piezoelectric transforming unit and the vertical capacitance, resulting in that the capacitance signal of the vertical capacitance changes and the piezoelectric signal of the piezoelectric material layer changes; the changed piezoelectric signal is transmitted to the external circuit by the top electrode and the bottom electrode, and the changed capacitance signal is transmitted to the external circuit by the interconnection circuit and the bottom electrode, thereby achieving the detection on the infrared light. Meanwhile, since the piezoelectric signal and the capacitance signal simultaneously change to obtain a stronger changed signal, the sensitivity of the detector is enhanced.

Referring to FIGS. 2-12, the manufacturing method of the infrared detector of the present embodiment is further described in detail below. In the present embodiment, the structure of the manufactured infrared detector is described as above; referring to FIG. 2, the manufacturing method of the present embodiment comprises of:

Step 01: providing a bonding substrate in which an infrared absorbing layer is formed.

Figure 3:
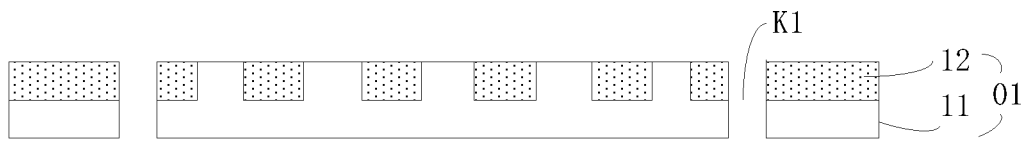
FIGS. 3-12 are schematic diagrams of respective manufacturing steps of a manufacturing method of an infrared detector pixel structure according to a preferred embodiment of the present invention.

Specifically, referring to FIG. 3, firstly, an infrared window layer 11 is formed in the bonding substrate 01; then, a plurality of trenches are etched out in the infrared window layer 11; the trenches shall be located below a region between the adjacent comb teeth of the lower comb-like unit and below the silicon substrate other than the closed cavity, but not located below the comb teeth of the lower comb-like unit; an infrared absorbing layer 12 is deposited in the plurality of trenches; and then, a first opening K1 is formed in the bonding substrate 01 other than the lower side of the closed cavity and is used to perform isolation between the adjacent pixel units.

Step 02: providing a silicon substrate in which a closed cavity region filled with infrared-sensitive gas is formed and bonding the silicon substrate with the bonding substrate.

Figure 4:

Specifically, the step 02 comprises of:

Step 021: referring to FIG. 4, depositing an oxide layer 03 in the top portion of the silicon substrate 02.

Herein, before the oxide layer 03 is deposited, a second opening K2 is etched out and formed in the silicon substrate 02 other than the closed cavity, and is used to isolate the closed cavity from the adjacent pixel structure; then the oxide layer 03 is deposited; wherein, the surface of the edge regions of the silicon substrate 02 other than the closed cavity region has the oxide layer 03.

Figure 5:
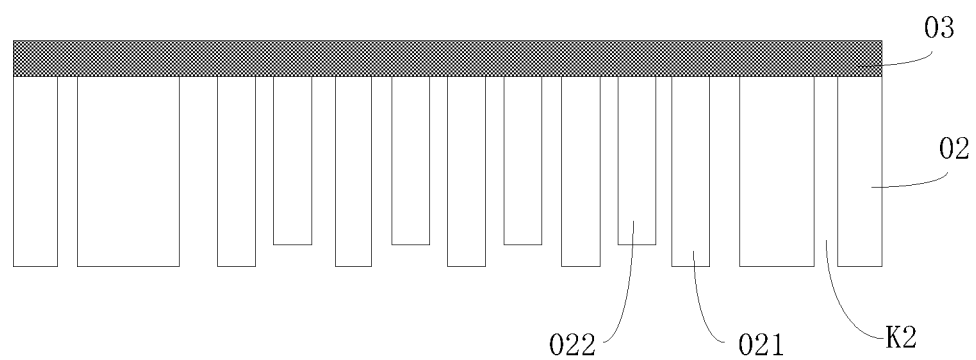

Step 022: referring to FIG. 5, etching out the upper comb-like unit 022 and the lower comb-like unit 021 in the silicon substrate 02, wherein the top portion of the upper comb-like unit 022 and the top portion of the lower comb-like unit 021 are in contact with the oxide layer 03; the bottom portion of the upper comb-like unit 022 is higher than the bottom portion of the lower comb-like unit 021.

Figure 6:
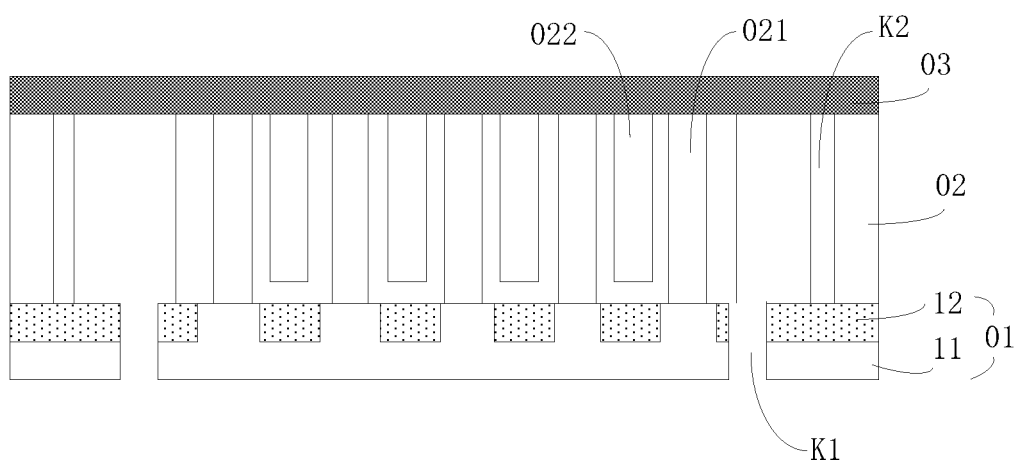

Step 023: referring to FIG. 6, bonding the bonding substrate 01 with the bottom portion of the silicon substrate 02.

Figure 7:
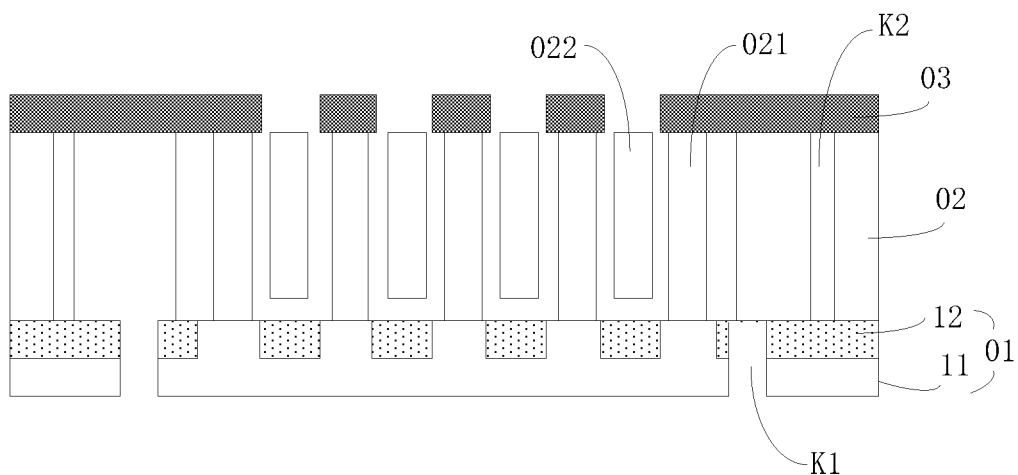

Step 024: referring to FIG. 7, etching out recesses in the oxide layer 03 corresponding to the top portion of the comb teeth of the upper comb-like unit 022.

Figure 8:
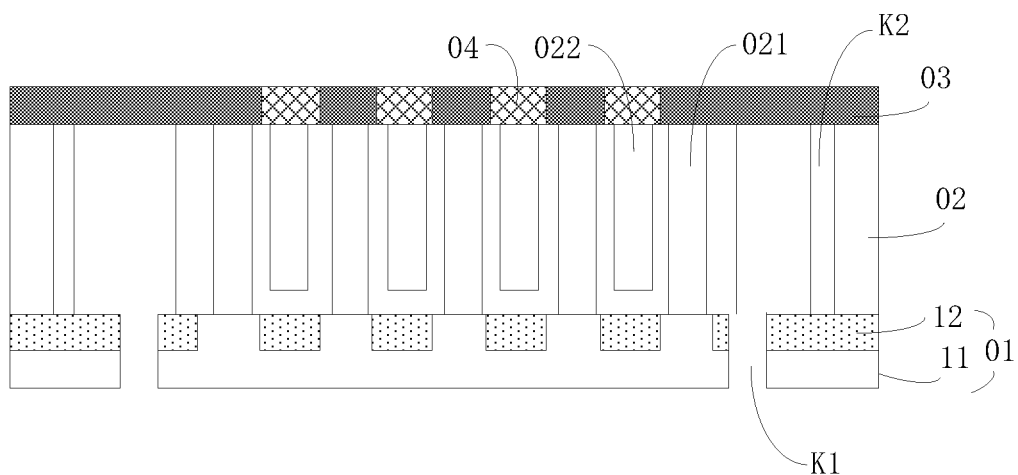

Step 025: referring to FIG. 8, filling conductive material in the recesses, and planarizing the top portion of the conductive material to be aligned with the top portion of the oxide layer 03 so as to form the contact blocks 04.

Figure 9:
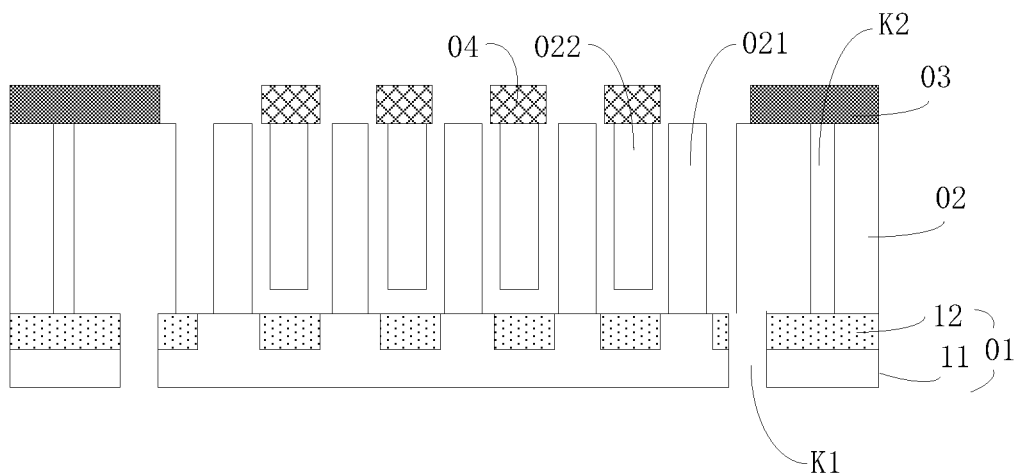

Step 026: referring to FIG. 9, removing the oxide layer 03 corresponding to upper side of the closed cavity region to remain the oxide layer 03 on the surface of the edge regions of the silicon substrate 02 other than the closed cavity region.

Step 03: bonding the piezoelectric transforming unit onto the silicon substrate, wherein the piezoelectric transforming unit is directly in contact with the closed cavity.

Figure 10:
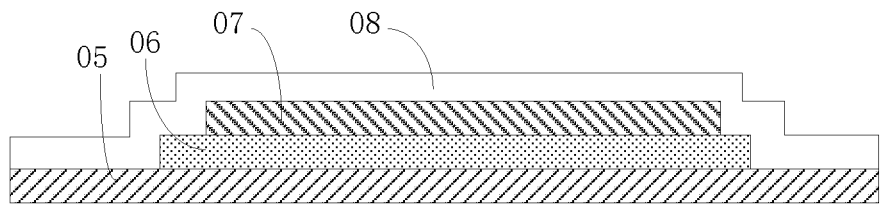
Figure 11:
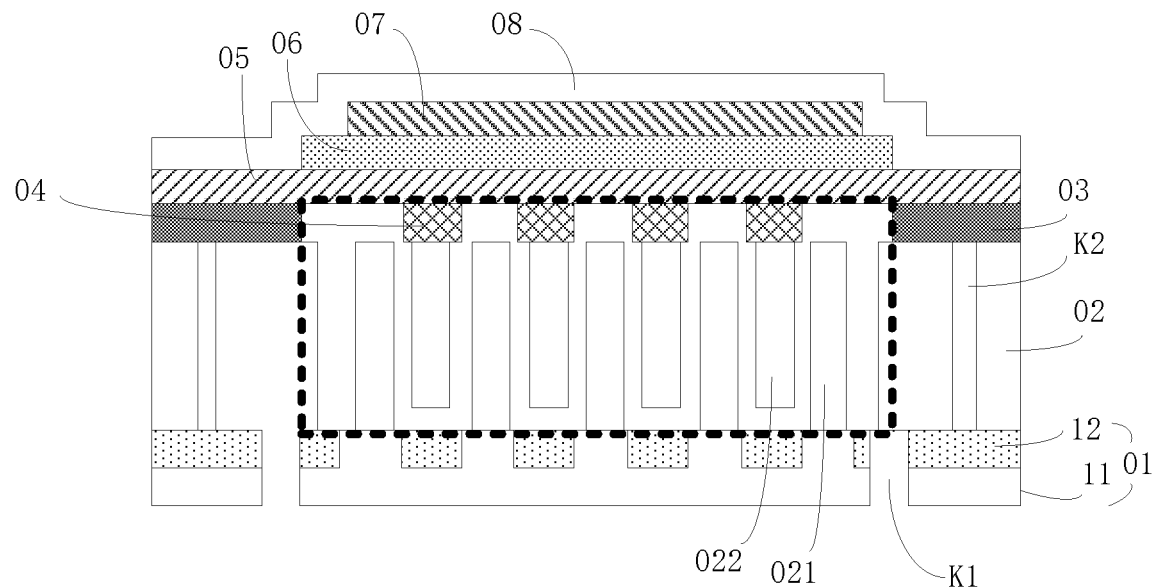

Specifically, the Step 03 comprises: firstly, referring to FIG. 10, the bottom electrode 05, the piezoelectric material layer 06 and the top electrode 07 are sequentially formed on one substrate, and the dielectric protection layer 08 may also be formed on the top electrode 07 so as to constitute the piezoelectric transforming unit; then referring to FIG. 11, the bottom portion of the piezoelectric transforming unit (the bottom portion of the bottom electrode 05) which has been manufactured is bonded with the top portions of the oxide layer 03 and the contact blocks 04.

Figure 12:
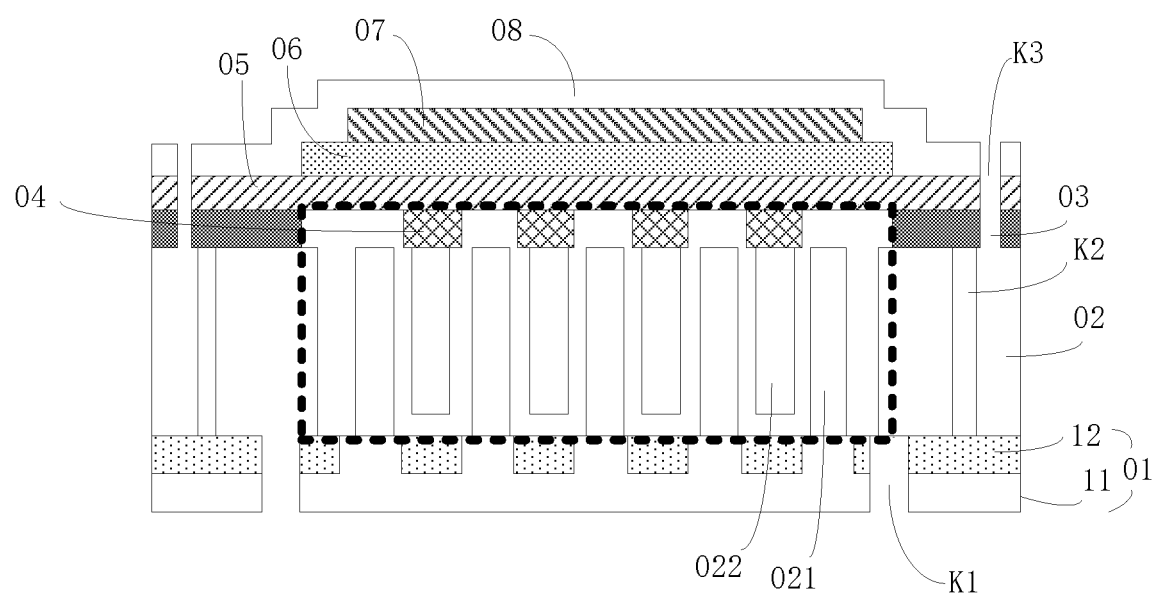

Finally, referring to FIG. 12, a third opening K4 is etched out in the oxide layer 03 and the piezoelectric member corresponding to upper side of the oxide layer 03, and is used for isolating the piezoelectric transforming unit from the adjacent pixel structure.

Embodiment 2

Hereinafter, the present invention will be further described in detail with reference to FIGS. 13-24 and specific embodiments. It should be noted that the drawings are made by adopting a very simplified form and using a non-precise ratio, and the purpose thereof is to auxiliary explain the present embodiment in an easy and clear way.

Figure 13:
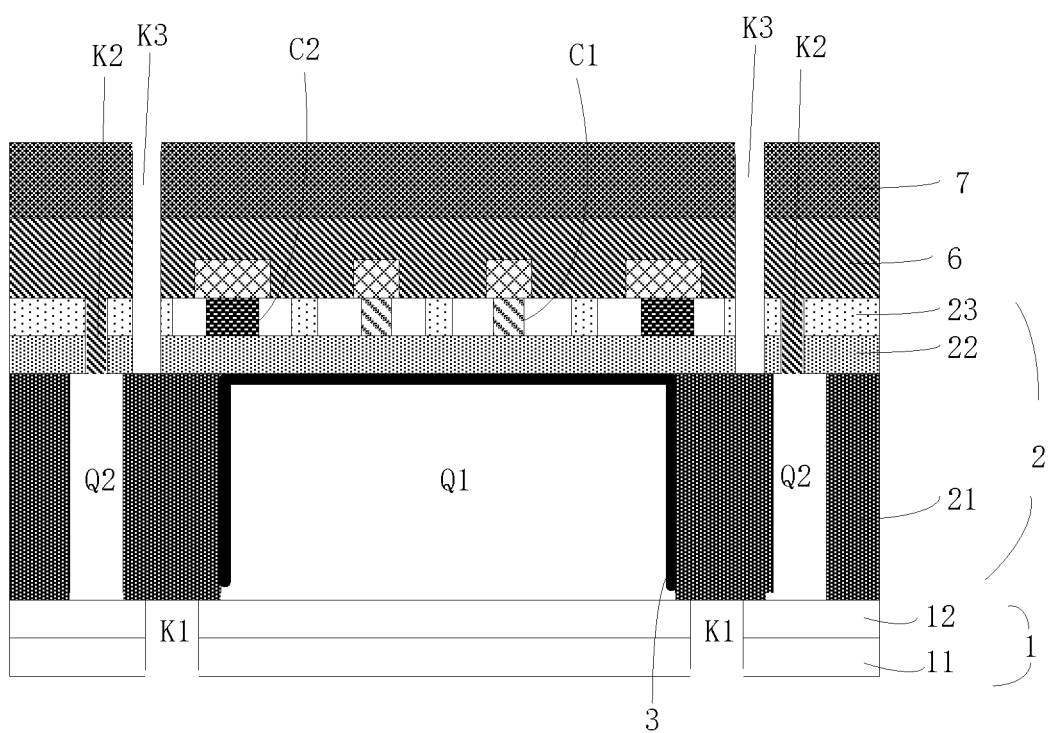
FIG. 13 is a schematic diagram of an infrared detector pixel structure according to a preferred embodiment of the present invention

Referring to FIG. 13, in the present embodiment, the infrared detector pixel structure comprises: a bonding substrate 1 and a SOI substrate 2 having a bottom silicon layer 21, interlayer dielectric 22 and a top silicon layer 23; wherein a silicon substrate with a closed cavity Q1 and a closed cavity Q2 is the bottom silicon layer 21 of the SOI substrate 2, and there are further the interlayer dielectric 22 and the top silicon layer 23 above the bottom silicon layer 21.

An infrared absorbing layer 12 and an infrared window layer 11 are sequentially included in the bonding substrate 1 from top to bottom, and the bonding substrate 1 is further provided with several first openings K1 which penetrate through the entire bonding substrate 1 to form a region surrounded by the first openings K1 and a region outside the region surrounded by the first openings K1 in the bonding substrate 1; the infrared window layer 11 is used to select waveband of the infrared light passing through therefrom; the infrared absorbing layer 12 is used to absorb the infrared light. Herein, the bonding substrate 1 may be a silicon substrate, the material of the infrared window layer 11 may be material through which the infrared light with certain waveband can pass, and the infrared absorbing layer 12 may be a silicon substrate itself, therefore it is only required to deposit the infrared window material layer on the silicon substrate in manufacturing; alternatively, the infrared absorbing layer and the infrared window layer may be sequentially formed on the silicon substrate.

The bottom silicon layer 21 of the SOI substrate 2 is located on the infrared absorbing layer 12 and the top portion of the first opening K1 is sealed; the first closed cavity Q1 and the second closed cavity Q2 located around the first closed cavity Q1 are included in the bottom silicon layer 21; the first closed cavity Q1 is located on a part of the infrared absorbing layer 12 in the region surrounded by the first opening K1, and the bottom portion of the first closed cavity Q1 is sealed by the part of the infrared absorbing layer 12 in the region surrounded by the first opening K1; the second closed cavity Q2 is located on a part of the infrared absorbing layer 12 outside the region surrounded by the first opening K1, and the bottom portion of the second closed cavity Q2 is sealed by the part of the infrared absorbing layer 12 outside the region surrounded by the first opening K1; wherein, there is reflective layer 3 at the top portion and sidewalls of the first closed cavity Q1; the first closed cavity Q1 is filled with infrared-sensitive gas; the infrared-sensitive gas is gas of which energy changes when being subjected to the infrared illumination, such as $CO_2$, CO, $CH_4$, $SO_2$ or the like with an infrared absorbing peak within waveband of 3 μm-30 μm; it is a vacuum state inside the second closed cavity Q2; the width of the first closed cavity Q1 is much greater than that of the second closed cavity Q2.

It is further provided with pre-metal dielectric 6, second opening K2 which penetrates through the interlayer dielectric 22 and the bottom silicon layer 21 and corresponds to the upper side of the second closed cavity Q2, a back-end interconnection layer 7 and third opening K3 which penetrates through the interlayer dielectric 22, the top silicon layer 23, the pre-metal dielectric 6 and the back-end interconnection layer 7; there are first MOS device with first conductive type channel C1 and second MOS device with second conductive type channel C2 surrounding the periphery of the first MOS device in the top silicon layer 23 above the first closed cavity Q1; the interlayer dielectric 22 seals the top portions of the first closed cavity Q1 and the second closed cavity Q2; the first conductive type and the second conductive type are opposite; for example, the first MOS device is PMOS and the second MOS device is NMOS, or the first MOS device is NMOS and the second MOS device is PMOS.

Wherein, the first conductive type channel C1 corresponds to middle region above the first closed cavity Q1, and the second conductive type channel C2 spans on a part of interlayer dielectric above the sidewalls of the first closed cavity Q1 and is set around the first conductive type channel C1; a part of the pre-metal dielectric 6 is filled in the second opening K2 so as to seal the top portion of the second closed cavity Q2, or the pre-metal dielectric 6 may also be fully filled in the second opening K2 but not be filled in the second closed cavity Q2; the third opening K3 is located on a part of the bottom silicon layer 21 between the first closed cavity Q1 and the second closed cavity Q2, and the bottom portion of the third opening K3 is sealed by the part of the bottom silicon layer 21 between the first closed cavity Q1 and the second closed cavity Q2; the second opening K2 is set around the third opening K3; the third opening K3 is set around the second MOS device; the shape of the second conductive type channel C2 is the same as the shape of the first closed cavity Q1, for example, if the first closed cavity Q1 is square, the first conductive type channel C1 and the second conductive type channel C2 are set in a concentric hollow square, for another example, if the first closed cavity is circular, the first conductive type channel C1 and the second conductive type channel C2 are set in a concentric ring; it can be seen from FIG. 1, the first conductive type channel C1 is rectangular, the second conductive type channel C2 is square, and the second conductive type channel C2 is completely located above the sidewalls of the first closed cavity Q1, such that the sidewalls of the first closed cavity Q1 can generate tensile stress on the second conductive type channel C2. The setting of the first opening K1, the second opening K2 and the second closed cavity Q2 may isolate the first closed cavity Q1 from other regions; specifically, the first opening is used for achieving the isolation of the back device region of the bonding substrate 1 from other regions; the second opening is used for opening the second closed cavity Q2 and forming vacuum after removing gas therein; the second closed cavity is used for isolating devices formed inside the silicon substrate (bottom silicon layer 21) from other portions. Similarly, the third opening is used for achieving the isolation of the device region of the SOI substrate 2 from other regions.

When the infrared detector pixel performs detection, infrared light with the desired waveband is selectively obtained after infrared light passes through the infrared window layer 11 and is filtered. After the infrared light with the desired waveband enters into the infrared absorbing layer 12, a part of the infrared light is absorbed by the infrared absorbing layer 12, while the infrared light which is not absorbed by the infrared absorbing layer 12 enters into the first closed cavity Q1; when the infrared light with the desired waveband enters into the first closed cavity Q1, the infrared-sensitive gas in the first closed cavity Q1 is illuminated by the infrared light with the desired waveband to occurs energy change, the middle region of the first closed cavity Q1 generates compressive stress on the first conductive type channel C1, and the sidewalls of the first closed cavity Q1 generates tensile stress on the second conductive type channel C2, such that the first MOS device and the second MOS device respectively generate opposite electrical signals to form a differential output. Meanwhile, the infrared light which is not absorbed by the infrared-sensitive gas is reflected into the first closed cavity Q1 by the reflective layer 3 at the top portion and sidewalls of the first closed cavity Q1, wherein a part of the reflected infrared light is absorbed by the infrared-sensitive gas, and a part of the reflected infrared light enters into the infrared absorbing layer 12 and is absorbed by the infrared absorbing layer 12. In detecting by infrared detector, a manner of shielding certain one pixel or pixels in certain one region is possible, such that signal difference is generated between electrical signal generated by the unshielded pixel and electrical signal generated by the shielded pixel, and thus it is easy to remove noise and obtain accurate clear signal. Principle on the differential output can be known by persons skilled in the art, and the detail thereof will not be described here again.

The manufacturing method of the above infrared detector pixel structure in the present embodiment may comprises of:
step 01: providing a bonding substrate in which an infrared absorbing layer is formed.

step 02: providing a bottom silicon layer in which a closed cavity filled with infrared-sensitive gas is formed to bond the bottom silicon layer with the bonding substrate.

step 03: forming the piezoelectric transforming unit on the bottom silicon layer.

Figure 14:
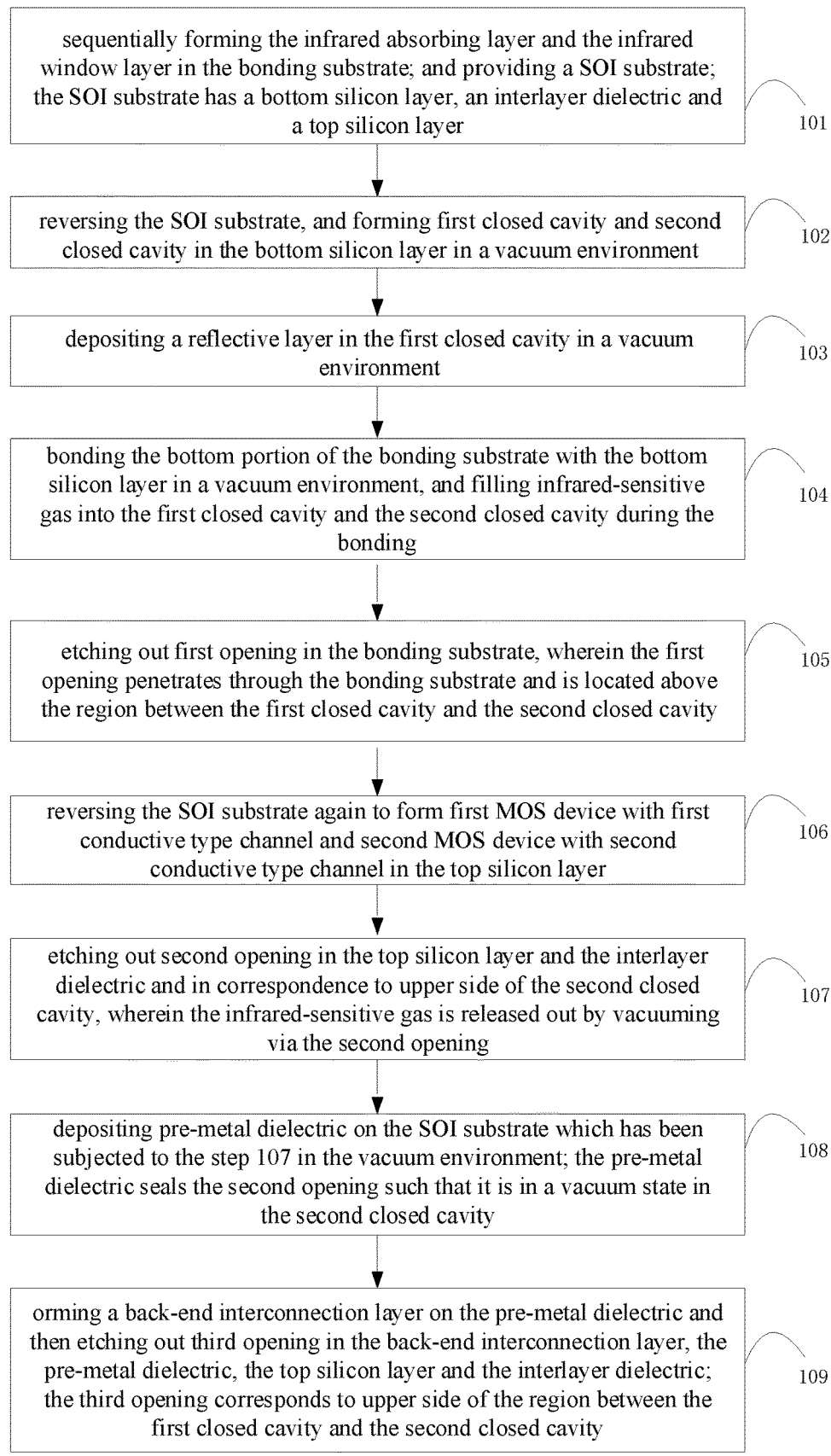
FIG. 14 is a schematic flow chart of a manufacturing method of an infrared detector pixel structure according to a preferred embodiment of the present invention

Referring to FIG. 14, in the present embodiment, the manufacturing method for manufacturing the above infrared detector pixel structure specifically comprises of:

Step 101: sequentially forming the infrared absorbing layer and the infrared window layer in the bonding substrate; and providing a SOI substrate; the SOI substrate has a bottom silicon layer, an interlayer dielectric and a top silicon layer.

Figure 15:
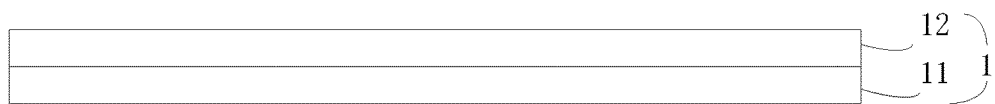
FIGS. 15-23 are schematic diagrams of respective manufacturing steps of a manufacturing method of an infrared detector pixel structure according to a preferred embodiment of the present invention.
Figure 15:
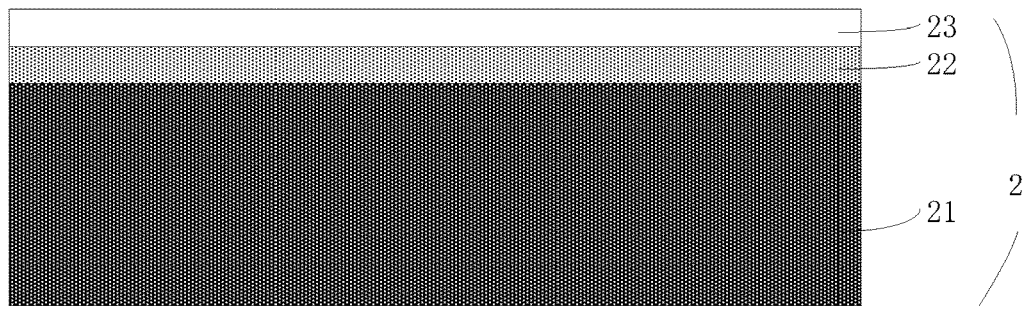

Specifically, referring to FIG. 15, the infrared absorbing layer 12 and the infrared window layer 11 are sequentially deposited on the silicon substrate 1 (the bonding substrate) by adopting a vapor deposition method, and the provided SOI substrate 2 may be a common SOI substrate and has the bottom silicon layer 21, the interlayer dielectric 22 and the top silicon layer 23.

Step 102: reversing the SOI substrate, and forming first closed cavity and second closed cavity in the bottom silicon layer in a vacuum environment.

Figure 16:
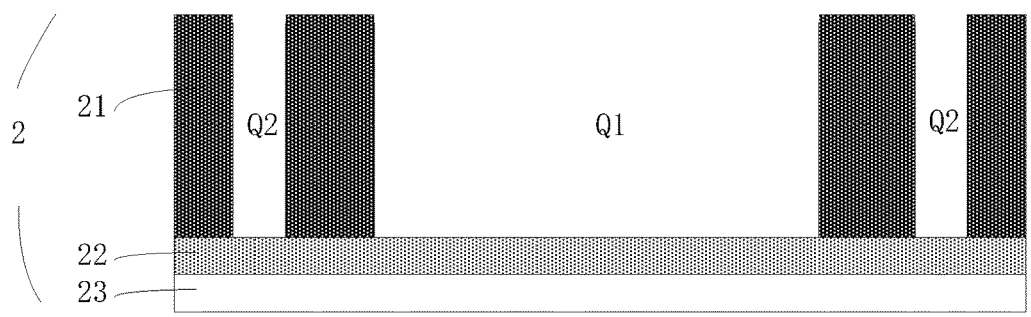

Specifically, referring to FIG. 16, the bottom silicon layer 21 of the SOI substrate 2 is made upward and the first closed cavity Q1 and the second closed cavity Q2 are etched out by adopting a plasma etching process. The width of the first closed cavity Q1 is much greater than that of the second closed cavity Q2.

Step 103: depositing a reflective layer in the first closed cavity in a vacuum environment.

Figure 17:
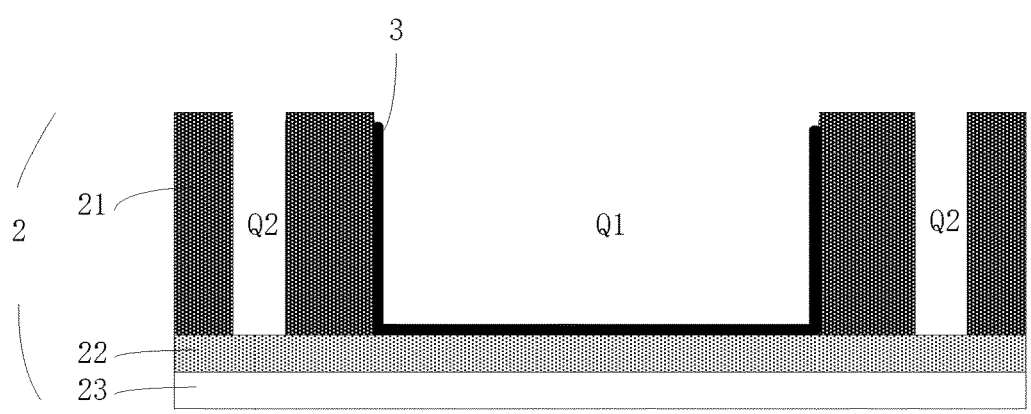

Specifically, referring to FIG. 17, the reflective layer 3 is deposited in the first closed cavity Q1 by adopting a vacuum vapor deposition method, and the reflective layer 3 may be a metal reflective layer. In consideration that the metal reflective layer has an effect of rapid transfer on the quantity of heat, the metal reflective layer should be avoided to be directly in contact with the infrared absorbing layer; therefore, when the reflective layer 3 is deposited in the first closed cavity Q1 in a vacuum environment, the height of the reflective layer 3 at the sidewalls of the first closed cavity Q1 is made lower than the height of the first closed cavity Q1, such that there is gap between the top portion of the reflective layer 3 at the sidewalls of the first closed cavity Q1 and the infrared absorbing layer 12.

Step 104: bonding the bottom portion of the bonding substrate with the bottom silicon layer in a vacuum environment, and filling infrared-sensitive gas into the first closed cavity and the second closed cavity during the bonding.

Figure 18:
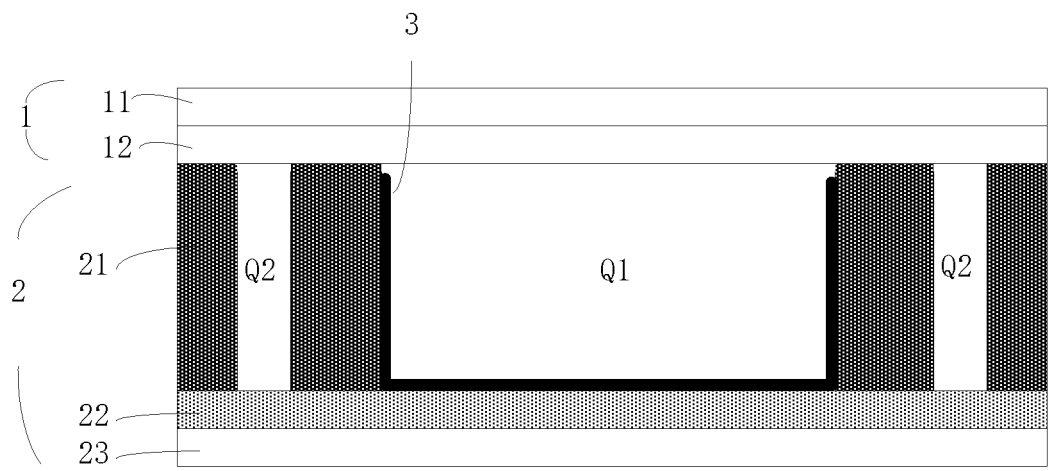

Specifically, referring to FIG. 18, the bottom portion of the silicon substrate 1 (the bonding substrate) may be bonded with the bottom silicon layer 21 by adopting a conventional bonding process, and for the process for filling the infrared-sensitive gas into the first closed cavity Q1 and the second closed cavity Q2, a non-vacuum bonding process is adopted to fill the infrared-sensitive gas into the first closed cavity Q1 and the second closed cavity Q2; after bonding, the first closed cavity Q1 and the second closed cavity Q2 both are filled with the infrared-sensitive gas, and the subsequent second opening on the surface of the SOI silicon wafer is opened to vacuum and remove the infrared-sensitive gas inside the second closed cavity.

Step 105: etching out first opening in the bonding substrate, wherein the first opening penetrates through the bonding substrate and is located above the region between the first closed cavity and the second closed cavity.

Figure 19:
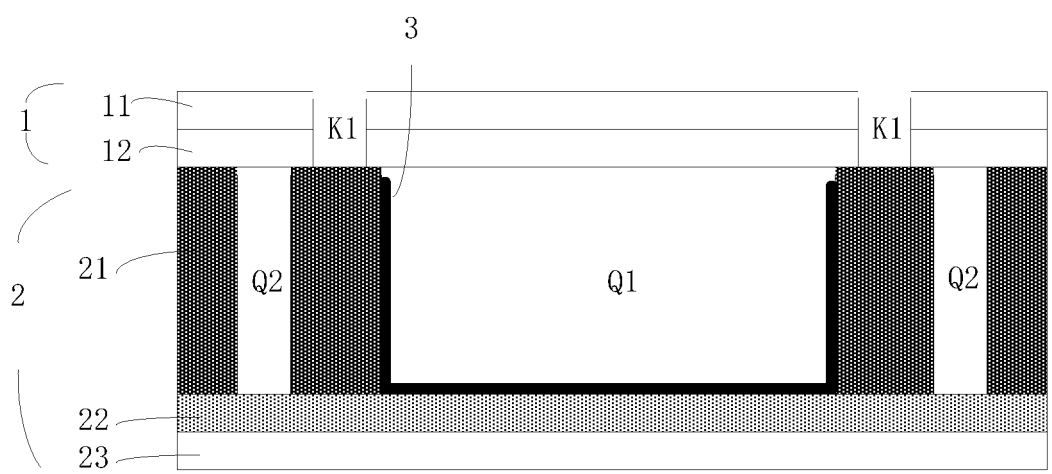

Specifically, referring to FIG. 19, the first opening K1 may be etched out in the silicon substrate 1 (the bonding substrate) by adopting a photolithography and plasma dry etching process; the first opening K1 penetrates through the silicon substrate 1 (the bonding substrate) and is located above the region between the first closed cavity Q1 and the second closed cavity Q2.

Step 106: reversing the SOI substrate again to form first MOS device with first conductive type channel and second MOS device with second conductive type channel in the top silicon layer.

Figure 20:
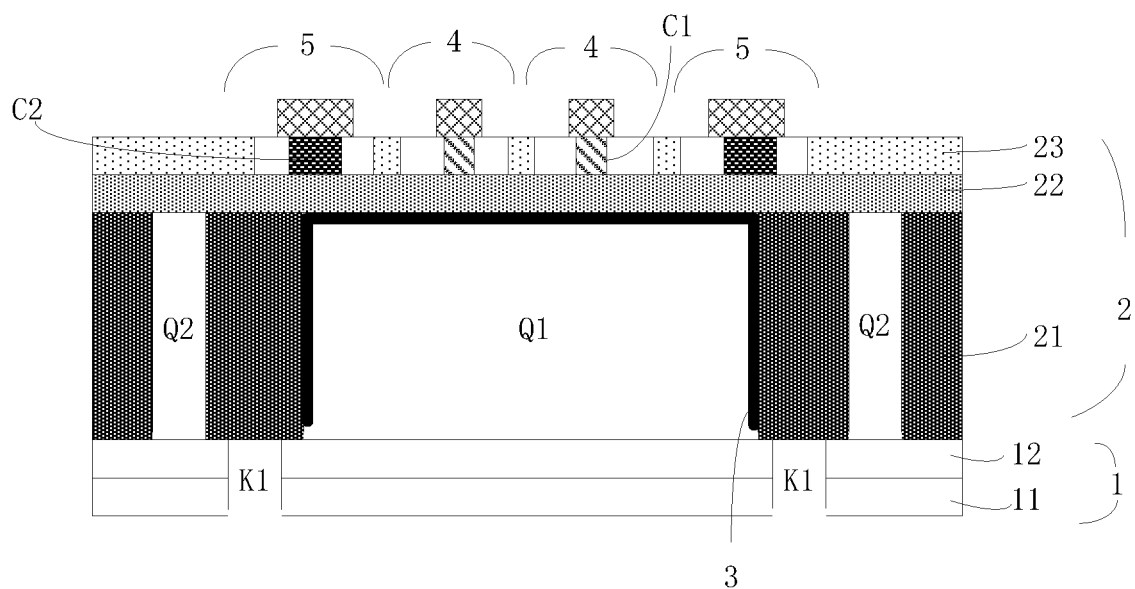

Specifically, referring to FIG. 20, the top silicon layer 23 of the SOI substrate 2 is made upward, and the first MOS device and the second MOS device are manufactured by adopting a conventional CMOS process; the detail thereof will not be described here again. Thus, the first MOS device with the first conductive type channel C1 and the second MOS device with the second conductive type channel C2 are formed in the top silicon layer 23.

Step 107: etching out second opening in the top silicon layer and the interlayer dielectric and in correspondence to upper side of the second closed cavity, wherein the infrared-sensitive gas is released out by vacuuming via the second opening.

Figure 21:
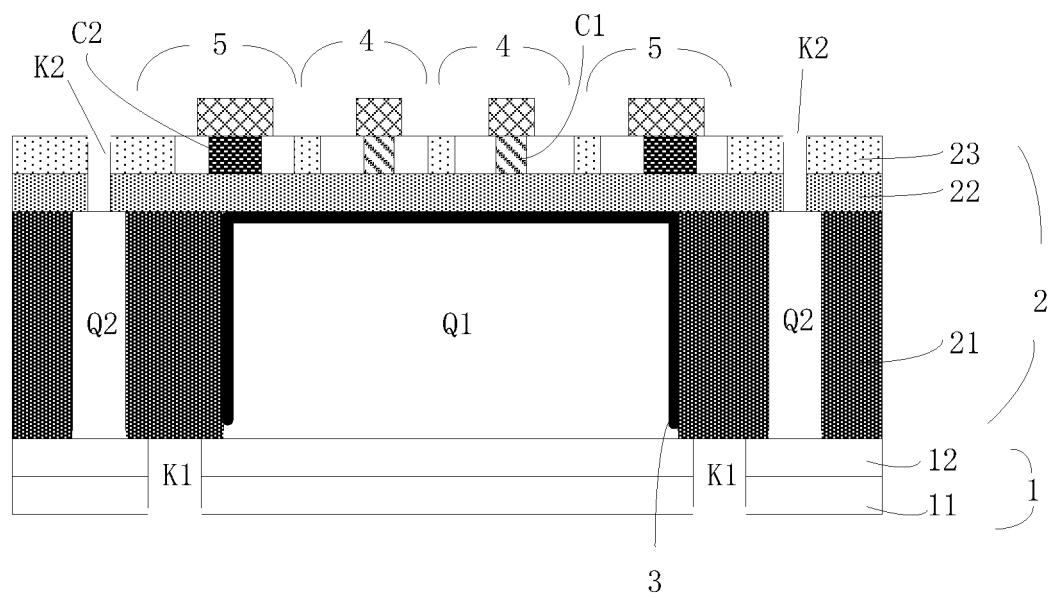

Specifically, referring to FIG. 21, the second opening K2 may be etched out in the top silicon layer 23 and the interlayer dielectric 22 and in correspondence to upper side of the second closed cavity Q2 by adopting photolithography and etching processes.

Step 108: depositing pre-metal dielectric on the SOI substrate which has been subjected to the step 107 in the vacuum environment; the pre-metal dielectric seals the second opening such that it is in a vacuum state in the second closed cavity.

Figure 22:
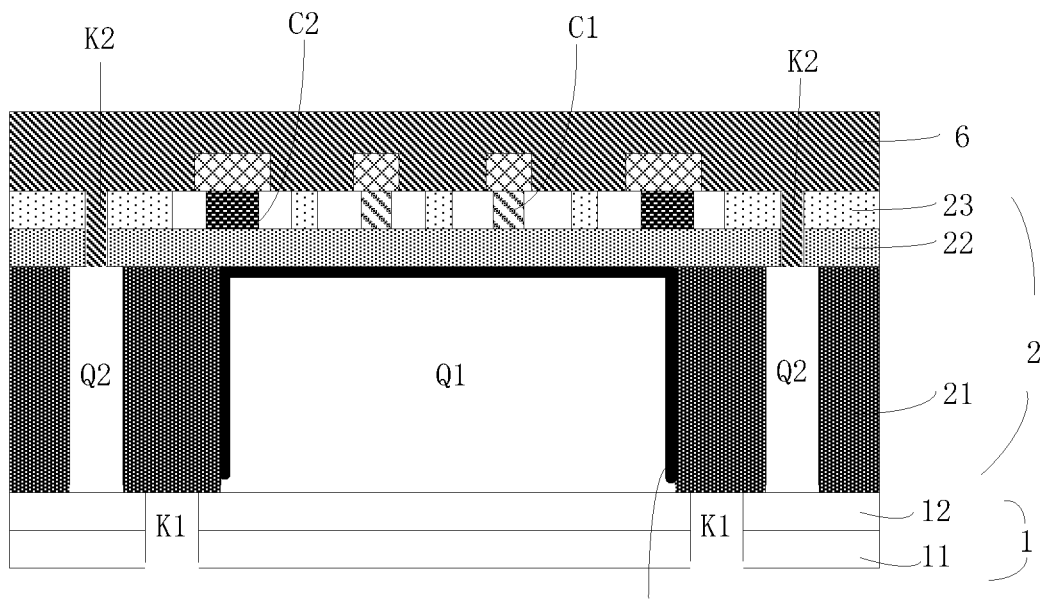

Specifically, referring to FIG. 22, herein, the pre-metal dielectric 6 may be deposited by adopting a vapor deposition method in the vacuum environment; the pre-metal dielectric 6 is made to seal the top portion of the second opening K2 by adjusting the process parameters, so as to from a vacuum state in the second opening K2; the pre-metal dielectric 6 is filled at the top portion of the second opening K2, or the pre-metal dielectric 6 are fully filled in the second opening K2, but the pre-metal dielectric 6 can't be filled in the second closed cavity Q2.

Step 109: forming a back-end interconnection layer on the pre-metal dielectric and then etching out third opening in the back-end interconnection layer, the pre-metal dielectric, the top silicon layer and the interlayer dielectric; the third opening corresponds to upper side of the region between the first closed cavity and the second closed cavity.

Figure 23:
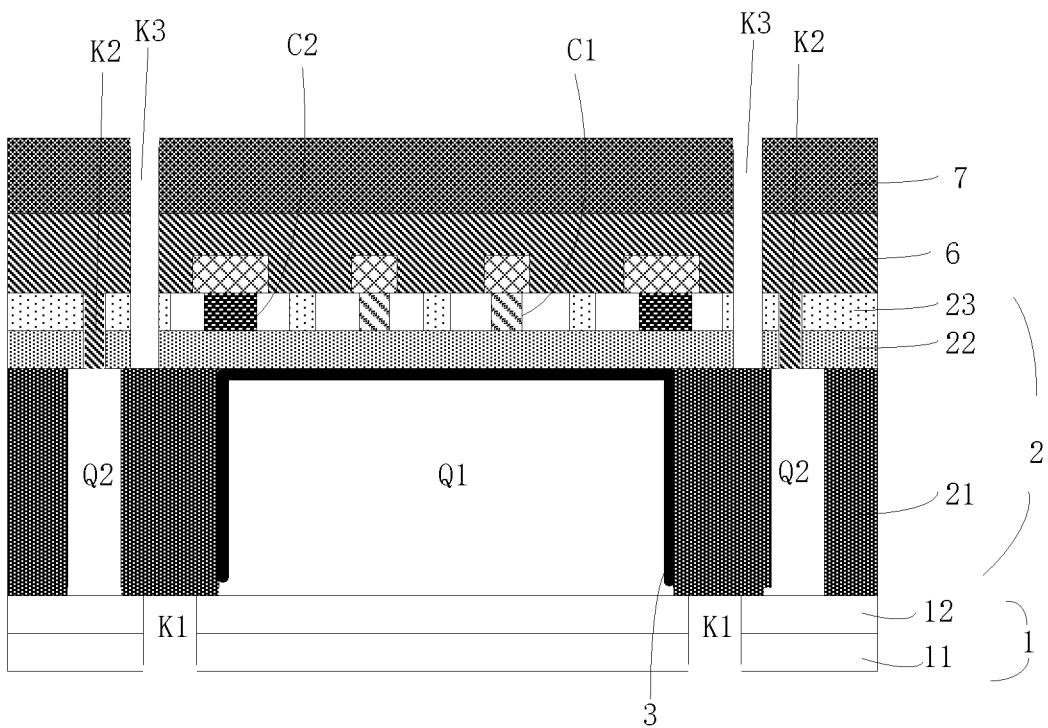

Specifically, referring to FIG. 23, for the manufacture of the back-end interconnection layer, a conventional process may be adopted, and the detail thereof will not be described here again; the third opening K3 may be etched out in the back-end interconnection layer 7, the pre-metal dielectric 6, the top silicon layer 23 and the interlayer dielectric 22 by adopting photolithography and etching processes. The third opening K3 corresponds to upper side of the region between the first closed cavity Q1 and the second closed cavity Q2.

Figure 24:
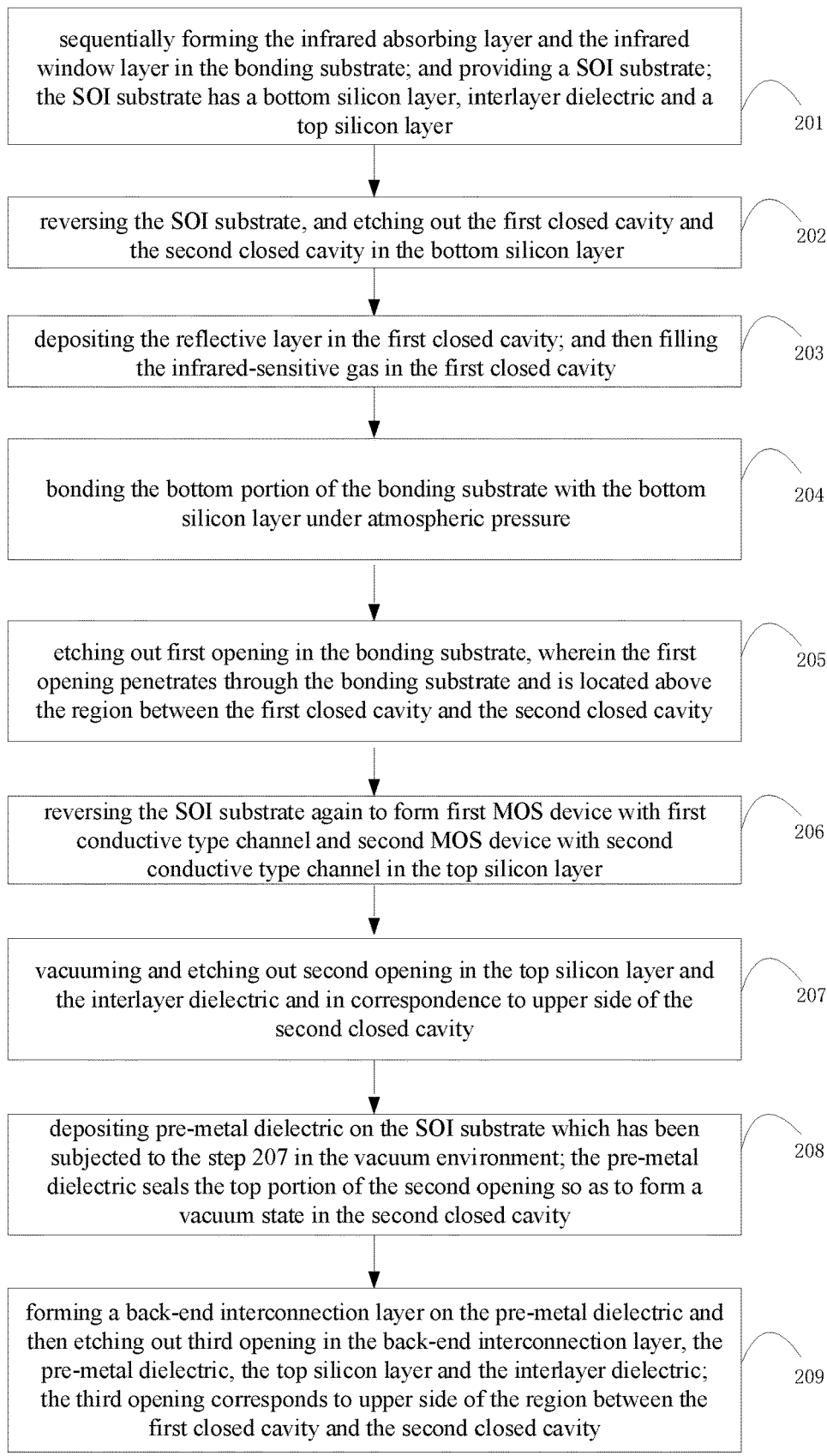
FIG. 24 is a schematic flow chart of a manufacturing method of an infrared detector pixel structure according to another preferred embodiment of the present invention

Referring to FIG. 24, the manufacturing method of the infrared detector pixel structure in another embodiment of the present invention specifically comprises of:

Step 201: sequentially forming the infrared absorbing layer and the infrared window layer in the bonding substrate; and providing a SOI substrate; the SOI substrate has a bottom silicon layer, interlayer dielectric and a top silicon layer.

Specifically, for this step 201, it may be referred to the description of the step 101 in the above embodiment, and the detail thereof will not be described here again.

Step 202: reversing the SOI substrate, and etching out the first closed cavity and the second closed cavity in the bottom silicon layer.

Specifically, for the step 202, it may be referred to the description of the step 102 in the above embodiment, and the detail thereof will not be described here again.

Step 203: depositing the reflective layer in the first closed cavity; and then filling the infrared-sensitive gas in the first closed cavity.

Specifically, the reflective layer may be deposited in the first closed cavity by adopting an atmospheric pressure vapor deposition method, and the reflective layer may be a metal reflective layer. In consideration that the metal reflective layer has an effect of rapid transfer on the quantity of heat, the metal reflective layer should be avoided to be directly in contact with the infrared absorbing layer; therefore, when the reflective layer is deposited in the first closed cavity in a vacuum environment, the height of the reflective layer at the sidewalls of the first closed cavity is made lower than the height of the first closed cavity, such that there is gap between the top portion of the reflective layer at the sidewalls of the first closed cavity and the infrared absorbing layer. While the infrared-sensitive gas is filled into the first closed cavity, it is inevitable that some infrared-sensitive gas enters into the second closed cavity; however, it is in the vacuum environment after the second opening is subsequently formed and when the pre-metal dielectric is deposited, and since some infrared-sensitive gas in the second closed cavity can be pumped out by vacuuming, the second closed cavity may subsequently form a vacuum state.

Step 204: bonding the bottom portion of the bonding substrate with the bottom silicon layer under atmospheric pressure.

Specifically, in bonding, both of the first closed cavity and the second closed cavity are filled with the infrared-sensitive gas.

Step 205: etching out first opening in the bonding substrate, wherein the first opening penetrates through the bonding substrate and is located above the region between the first closed cavity and the second closed cavity.

Step 206: reversing the SOI substrate again to form first MOS device with first conductive type channel and second MOS device with second conductive type channel in the top silicon layer.

Step 207: vacuuming and etching out second opening in the top silicon layer and the interlayer dielectric and in correspondence to upper side of the second closed cavity.

Specifically, the processes of opening the second opening and subsequently depositing the pre-metal dielectric both are performed in a vacuum environment, therefore if there are the infrared-sensitive gas or other gas inside the second closed cavity, they can be pumped out to form vacuum state.

Step 208: depositing pre-metal dielectric on the SOI substrate which has been subjected to the step 207 in the vacuum environment; the pre-metal dielectric seals the top portion of the second opening so as to form a vacuum state in the second closed cavity.

Step 209: forming a back-end interconnection layer on the pre-metal dielectric and then etching out third opening in the back-end interconnection layer, the pre-metal dielectric, the top silicon layer and the interlayer dielectric; the third opening corresponds to upper side of the region between the first closed cavity and the second closed cavity.

Specifically, for the detail description of the steps 205~209, it may be referred to the description of the steps 105~109 in the above embodiment, and the detail thereof will not be described here again.

While this invention has been particularly shown and described with references to preferred embodiments thereof, if will be understood by those skilled in the art that various changes in form and details may be made herein without departing from the spirit and scope of the invention as defined by the appended claims.

The invention claimed is:

1. An infrared detector pixel structure wherein comprises:
a bonding substrate, a silicon substrate bonded onto the bonding substrate, and a piezoelectric transforming unit located on the silicon substrate; wherein,
there is an infrared absorbing layer in the bonding substrate; the infrared absorbing layer is used for absorbing infrared light;
a closed cavity region filled with infrared-sensitive gas is included in the silicon substrate;
the piezoelectric transforming unit is located above the closed cavity region of the silicon substrate; wherein, after the infrared light is selectively passed by an infrared window layer, a part of the infrared light is absorbed by the infrared absorbing layer, a part of the infrared light enters into the closed cavity through the infrared absorbing layer and is absorbed by the infrared-sensitive gas in the closed cavity; the infrared-sensitive gas in the closed cavity generates quantity of heat after absorbing the infrared light and the quantity of heat generated after the infrared absorbing layer absorbs infrared light is transferred to the infrared-sensitive gas, such that the infrared-sensitive gas expands and acts on the piezoelectric transforming unit, and a piezoelectric signal formed by the piezoelectric transforming unit changes, to realize detection of the infrared light.

2. The infrared detector pixel structure according to claim 1, wherein further comprises an oxide layer on a surface of an edge region of the silicon substrate outside the closed cavity region; the piezoelectric transforming unit comprises a bottom electrode, a top electrode, and a piezoelectric material layer located between the bottom electrode and the top electrode; the bottom electrode is bonded onto the silicon substrate and the oxide layer; the bottom electrode is directly in contact with the closed cavity; when the infrared-sensitive gas expands and acts on the piezoelectric transforming unit, the piezoelectric signal formed by the piezoelectric material layer of the piezoelectric transforming unit changes and the changed piezoelectric signal is transmitted to an external circuit by the top electrode and the bottom electrode.

3. The infrared detector pixel structure according to claim 2, wherein the closed cavity region of the silicon substrate has an upper comb-like unit and a lower comb-like unit, and a top portion of the upper comb-like unit is in contact with and connected to the bottom electrode; a lower side of the bottom electrode is connected with a plurality of contact blocks of which bottom portion is in contact with and connected to the top portion of the upper comb-like unit; a comb-tooth of the upper comb-like unit and a comb-tooth of the lower comb-like unit are set alternately; there is gap between the bottom portion of the upper comb-like unit and the infrared absorbing layer; the bottom portion of the cavity between comb teeth of the lower comb-like unit is in contact with and connected to the infrared absorbing layer; the cavity between the upper comb-like unit and the lower comb-like unit is sealed by the bottom electrode, the oxide layer, the silicon substrate other than the closed cavity and the bonding substrate to form the closed cavity region.

4. The infrared detector pixel structure according to claim 3, wherein the bonding substrate further has an interconnection circuit therein; comb teeth of the upper comb-like unit and the lower comb-like unit which are adjacent and the infrared-sensitive gas therebetween constitute a vertical capacitance, the lower electrode of the vertical capacitance is constituted by electrically connecting comb teeth of the lower comb-like unit to the interconnection circuit, and the bottom electrode of the piezoelectric transforming unit is served as upper electrode of the vertical capacitance; when the infrared-sensitive gas expands, the pressure of the infrared-sensitive gas acts on the piezoelectric transforming unit and the vertical capacitance, which results in that a capacitance signal of the vertical capacitance changes and the piezoelectric signal of the piezoelectric material layer of the piezoelectric transforming unit changes, the changed piezoelectric signal is transmitted to the external circuit by the top electrode and the bottom electrode, and the changed capacitance signal is transmitted to the external circuit by the interconnection circuit and the bottom electrode, thereby achieving detection on the infrared light.

5. The infrared detector pixel structure according to claim 3, wherein the infrared window layer has a plurality of trenches which are located below a region between two adjacent comb teeth of the lower comb-like unit and below the silicon substrate other than the closed cavity but not located below the comb teeth of the lower comb-like unit; the infrared absorbing layer is filled in the plurality of trenches.

6. The infrared detector pixel structure according to claim 3, wherein a top portion of the piezoelectric transforming unit further has a dielectric protecting layer which covers on the entire piezoelectric transforming unit.

7. The infrared detector pixel structure according to claim 3, wherein a surface of an edge region of the silicon substrate other than the closed cavity region has an oxide layer; in the piezoelectric transforming unit, the piezoelectric material layer corresponds to upper side of the upper comb-like unit and an edge region of the piezoelectric material layer is not located in the region corresponding to upper side of the oxide layer, an edge region of the bottom electrode covers on the oxide layer, and the length of the top electrode is smaller than the length of the piezoelectric material layer, such that the dielectric protecting layer covering on the entire piezoelectric transforming unit forms a multi-stepwise structure.

8. The infrared detector pixel structure according to claim 1, wherein in the bonding substrate, it is further provided with an infrared window layer located at a bottom portion of the infrared absorbing layer, the infrared window layer being used for selecting waveband of the infrared light passing through therefrom.

9. The infrared detector pixel structure according to claim 1, wherein the piezoelectric transforming unit includes a first MOS device with a first conductive type channel and a second MOS device with second conductive type channel surrounding the periphery of the first MOS device; the first conductive type and the second conductive type are opposite; the first conductive type channel corresponds to middle region above the closed cavity, and the second conductive type channel spans on a part of interlayer dielectric above sidewalls of the closed cavity and is set around the first conductive type channel.

10. A method of manufacturing the infrared detector pixel structure according to claim 1, wherein comprising of:
    step 01: providing the bonding substrate in which the infrared absorbing layer is formed;
    step 02: providing the silicon substrate in which a closed cavity region filled with infrared-sensitive gas is formed to bond the silicon substrate with the bonding substrate;
    step 03: bonding the piezoelectric transforming unit onto the silicon substrate and making the piezoelectric transforming unit be directly in contact with the closed cavity; wherein, the piezoelectric transforming unit includes a bottom electrode, a top electrode, and a piezoelectric material layer located between the top electrode and the bottom electrode.

11. The method according to claim 10, wherein the step 02 specifically comprises of:
    step 021: depositing a oxide layer on the top portion of the silicon substrate;
    step 022: etching out the upper comb-like unit and the lower comb-like unit in the silicon substrate, wherein, a top portion of the upper comb-like unit and a top portion of the lower comb-like unit are in contact with the oxide layer; a bottom portion of a upper comb-like unit is higher than that of the lower comb-like unit;
    step 023: bonding the bonding substrate with a bottom portion of the silicon substrate;
    step 024: etching out recesses in the oxide layer corresponding to a top portion of the comb teeth of the upper comb-like unit;
    step 025: filling conductive material in the recesses and planarizing the top portion of the conductive material to be aligned with a top portion of the oxide layer, to form the contact blocks;
    step 026: removing the oxide layer corresponding to the upper side of the closed cavity region to remain the oxide layer on a surface of the edge region of the silicon substrate other than the closed cavity region.

12. The method according to claim 11, wherein the step 01 specifically comprises of: firstly forming an infrared window layer in the bonding substrate; then etching out a plurality of trenches in the infrared window layer, wherein the trenches are located below a region between two adjacent comb teeth of the lower comb-like unit and below the silicon substrate other than the closed cavity but not located below comb teeth of the lower comb-like unit; further depositing the infrared absorbing layer in the plurality of trenches.

13. The method according to claim 10, wherein
    the step 01 specifically comprises of: sequentially forming the infrared absorbing layer and the infrared window layer in the bonding substrate; and providing a SOI substrate; the SOI substrate has a bottom silicon layer, an interlayer dielectric and a top silicon layer;
    the step 02 specifically comprises of:
    step 021': reversing the SOI substrate, and forming a first cavity and a second cavity in the bottom silicon layer in a vacuum environment;
    step 022': depositing the reflective layer in the first cavity in the vacuum environment;
    step 023': bonding the bottom portion of the bonding substrate with the bottom silicon layer in the vacuum environment, and filling the infrared-sensitive gas in the first cavity and the second cavity during bonding;
    the step 03 specifically comprises of:
    step 031': etching out a first opening in the bonding substrate, the first opening penetrating through the bonding substrate and being located above a region between the first cavity and the second cavity;
    step 032': reversing the SOI substrate again and forming a first MOS device with first conductive type channel and a second MOS device with second conductive type channel in the top silicon layer;
    step 033': etching out second opening in the top silicon layer and the interlayer dielectric and in correspondence to upper side of the second cavity, wherein the infrared-sensitive gas in the second cavity is released out by vacuuming via the second opening;
    step 034': depositing pre-metal dielectric on the SOI substrate which has been subjected to the step 033' in the vacuum environment; the pre-metal dielectric sealing the top portion of the second opening such that it is in a vacuum state in the second opening;
    step 035': forming the back-end interconnection layer on the pre-metal dielectric and then etching out a third opening in the back-end interconnection layer, the pre-metal dielectric, the top silicon layer and the interlayer dielectric; the third opening corresponding to upper side of the region between the first cavity and the second cavity.

\* \* \* \* \*